United States Patent [19]
Steinke

[11] Patent Number: 6,157,188
[45] Date of Patent: Dec. 5, 2000

[54] COMPACT, LONG-RANGE ABSOLUTE POSITION TRANSDUCER WITH AN EXTENSIBLE COMPACT ENCODING

[75] Inventor: Kurt E. Steinke, Bellevue, Wash.

[73] Assignee: Mitutoyo Corporation, Kanagawa-Ken, Japan

[21] Appl. No.: 09/143,790

[22] Filed: Aug. 31, 1998

[51] Int. Cl.[7] .............................. G01B 7/02; G01B 7/14; G01D 5/20; H03M 1/22
[52] U.S. Cl. ................. 324/207.17; 324/207.24; 340/870.32; 336/45; 336/131; 341/15
[58] Field of Search .................. 324/207.15–207.19, 324/207.24; 336/130, 131, 136, 45; 340/870.32, 870.33, 870.35, 870.36; 341/15; 318/653–657

[56] References Cited

U.S. PATENT DOCUMENTS

| | | | |
|---|---|---|---|
| 4,697,144 | 9/1987 | Howbrook | 324/207.17 |
| 4,879,508 | 11/1989 | Andermo | 324/690 |
| 4,893,077 | 1/1990 | Auchterlonie | 324/262 |
| 5,023,599 | 6/1991 | Mitchell et al. | 340/467 |
| 5,027,526 | 7/1991 | Crane | 33/763 |
| 5,841,274 | 11/1998 | Masreliez et al. | 324/207.17 |
| 5,886,519 | 3/1999 | Masreliez et al. | 324/207.17 |

*Primary Examiner*—Jay Patidar
*Attorney, Agent, or Firm*—Oliff & Berridge, PLC

[57] ABSTRACT

A compact, long-range inductive absolute position transducer system has two members movable relative to each other and includes a code track transducer and at least one fine wavelength transducer. The two members include a read head member and a scale member. The phase difference between the phase angles of two fine wavelength transducers may be used to generate an intermediate wavelength. Alternatively, the phase difference between the phase angles of one fine wavelength transducer and the code track transducer may be used to generate an intermediate wavelength. The code track includes sequential n-bit code words. Each sequential code word identifies an absolute position of one member with respect to the other with a first resolution. Each intermediate wavelength includes an integer number of code words greater than or equal to one. Using this relationship, the intermediate wavelength is used to identify the start position (start bit) of the appropriate code word. A fine track transducer is then used to define an absolute position of the read head member relative to the scale member to a second, finer resolution.

26 Claims, 9 Drawing Sheets

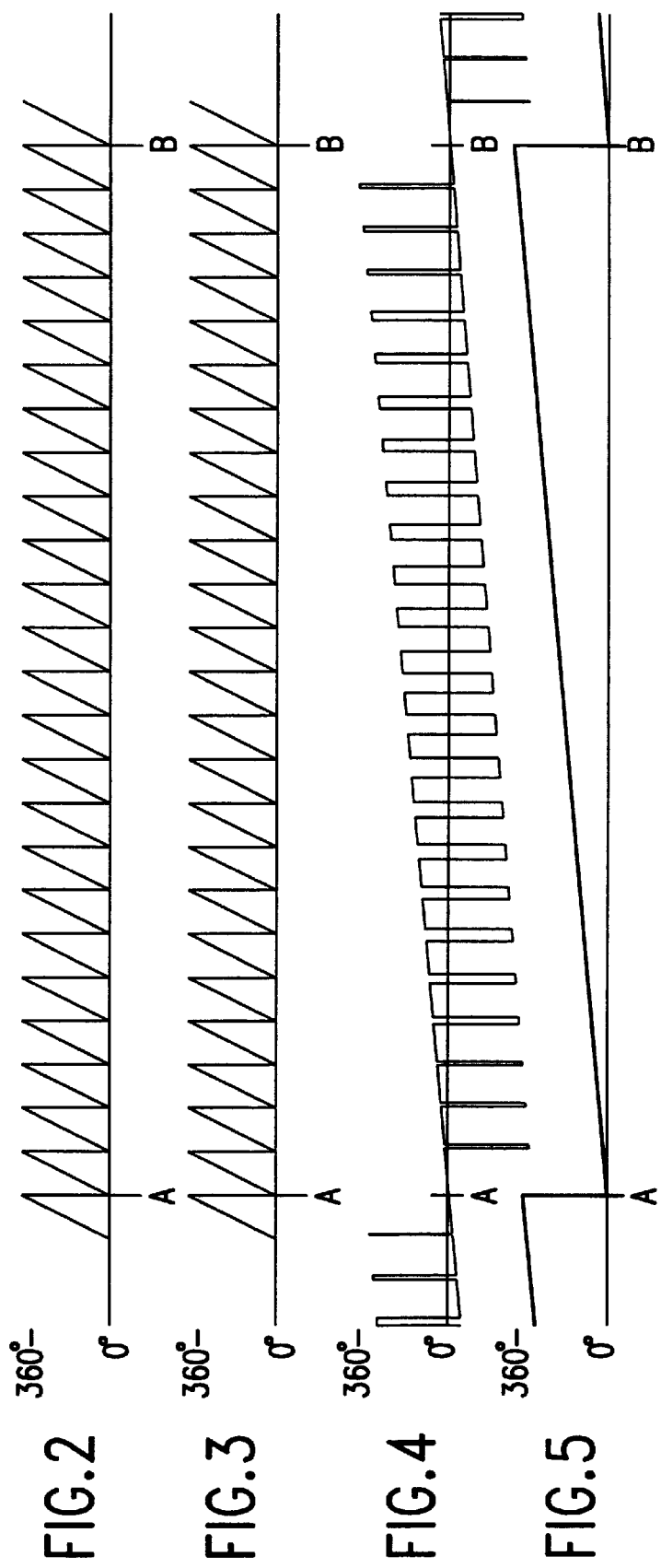

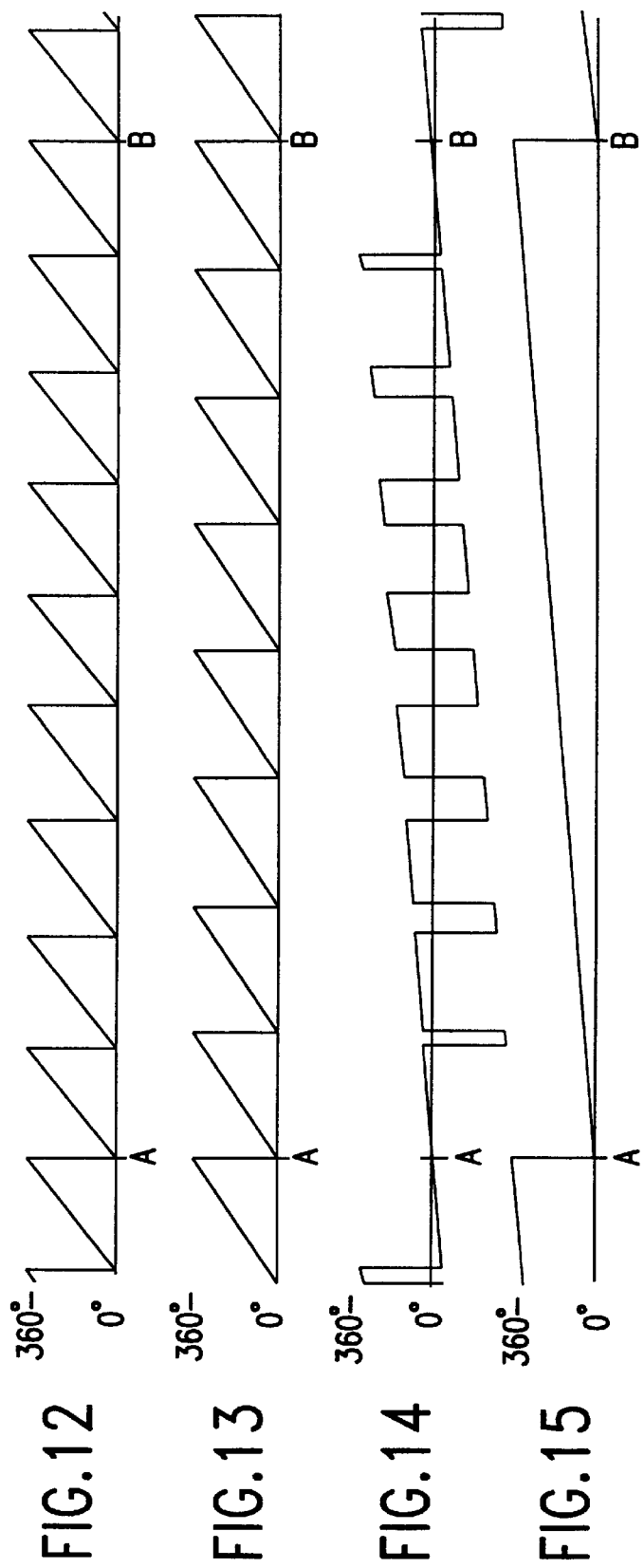

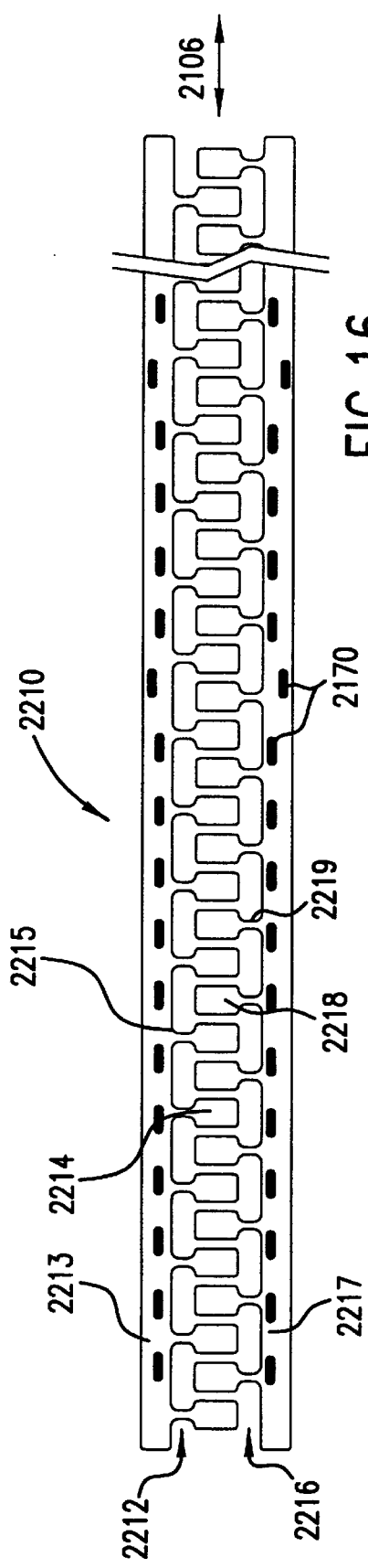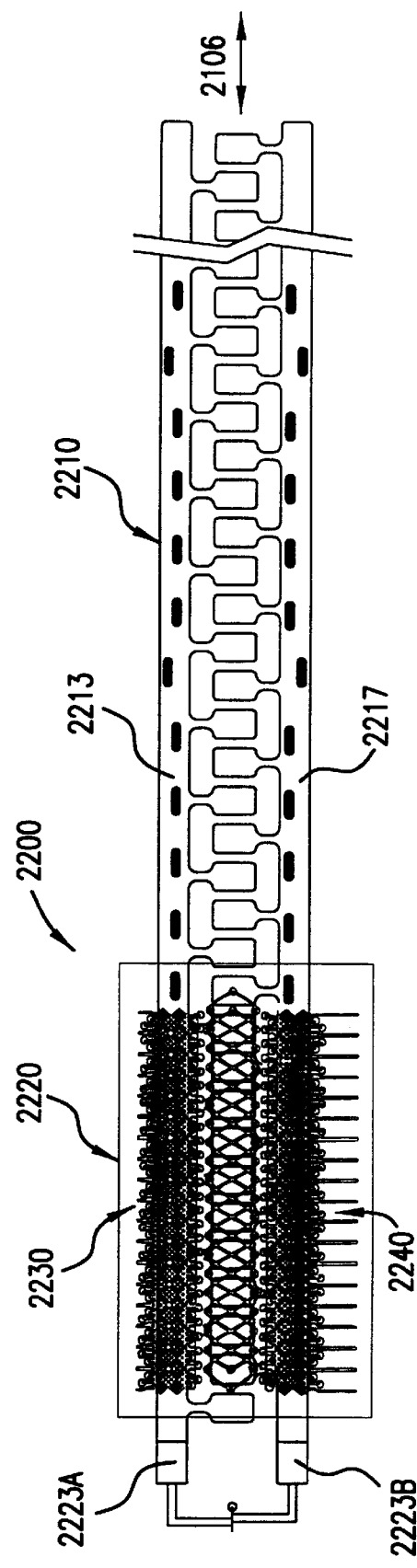

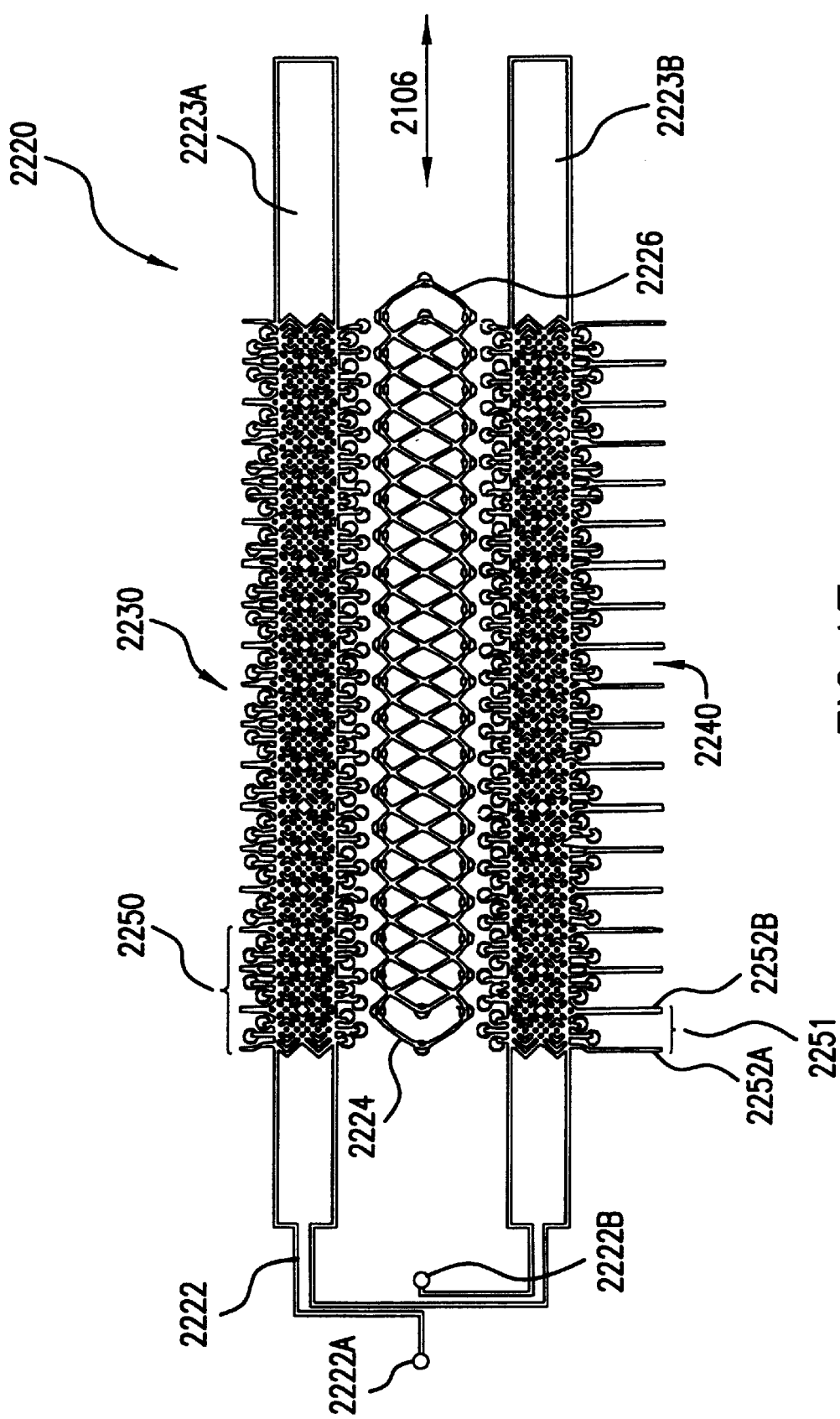

COMPACT, LONG-RANGE ABSOLUTE POSITION TRANSDUCER WITH AN EXTENSIBLE COMPACT ENCODING

BACKGROUND OF THE INVENTION

1. Field of the Invention

This invention relates to an absolute position inductive transducer. More particularly, this invention is directed to an absolute position inductive transducer that includes a compact, long-range code track for extending the length of the absolute position scale.

2. Description of Related Art

U.S. Pat. No. 4,893,077 to Auchterlonie describes an absolute position sensor employing several linear tracks of inductive transducers. Each track of this sensor has a slightly different wavelength or frequency. The circuits in the sensor analyze the phase difference between the tracks to determine the absolute position of the read head. Similar known systems employ capacitive transducers having multiple tracks of capacitive elements, such as U.S. Pat. Nos. 4,879,508 and 5,023,599 to Andermo. The absolute position sensors of Auchterlonie and Andermo, however, suffer from a number of problems, including scale length limitations, sensitivity to contamination, increased manufacturing costs due to tight tolerance requirements, and difficulty to incorporate into hand-held devices.

U.S. Pat. No. 4,697,144 to Howbrook discloses a transducer that employs several pitches of coils (each pitch representing 360° of phase change) to similarly provide an absolute position using an inactive member. This transducer, however, has a limited range within which to determine the absolute position of the inactive member. Additionally, this transducer fails to provide sufficient accuracy for most applications.

U.S. Pat. No. 5,027,526 to Crane describes an optical transducer that reads a bar code pattern printed on a coiled tape. This bar code pattern is the standard interleaved 2 of 5 bar code symbol that encodes several numbers between start and stop bar code patterns. The numbers, in turn, correspond to a coarse absolute position of the tape. Circuits read the bar code symbols and convert them to numbers representing the absolute position of the tape. Clockings based on the position of a drum that coils the tape determine a fine position measurement.

This absolute transducer, however, suffers from traditional problems of optical transducers, such as scale length limitations, sensitivity to contamination, increased manufacturing costs, and large current supply requirements. Furthermore, this absolute transducer is not a true absolute transducer at every position, because the transducer requires a scanning motion through a range as long as the bar code in order to derive or update an absolute position measurement. This renders it unusable for many applications.

U.S. patent application Ser. Nos. 08/788,469 now U.S. Pat. No. 5,886,519 and 08/790,494 now U.S. Pat. No. 5,841,274 to Masreliez et al., filed Jan. 29, 1997, each herein incorporated by reference in its entirety, disclose a number of longer-range absolute position transducers. One current absolute position transducer increases the absolute position range by using multiple analog tracks with different repeat lengths. However, the current state of the art for inductive and capacitive transducers imposes a maximum practical ratio of wavelengths between tracks of about 32:1 (regardless of whether the ratio is established by the primary wavelengths, or by a beat frequency between closely spaced wavelengths), a minimum for the fine wavelengths from 1.28 mm to 5.12 mm, and read head lengths of at least five fine wavelengths for most metrology applications. Longer fine wavelengths provide proportionately lower resolution and accuracy. Therefore, the maximum length of a two-track scale would be 32 fine wavelengths (about 40 to 160 mm). Longer scales would require more tracks, more read heads, and wider overall scale width, thus are more expensive and require a larger physical size. A typical scale with a fine wavelength of 2.56 mm would require 3 tracks and read heads to achieve a scale length of between 80 mm and 2500 mm.

Another current absolute position transducer disclosed in Masreliez uses binary coded tracks to increase the absolute position range. This transducer requires a code track having N-bit code words and N read heads to achieve a coarse scale length of $2^N$ fine wavelengths. A scale would require 8 read heads to achieve a coarse scale length of 256 fine wavelengths. This transducer uses a pseudo-random sequence of code words analyzed along the code track. Shifting the read head by one code position anywhere in the sequence will generate a unique code word, distinguishable from all other code words. Each code word position corresponds to and uniquely identifies a particular fine wavelength of a fine wavelength scale having approximately $2^N$ fine wavelengths. Once the particular fine wavelength is identified, the fine wavelength scale can be used to identify the absolute position to a fine resolution. However, the length of this transducer is limited to the length of the coarse wavelength. Further, not all code words are usable because of the inability to unambiguously determine certain code words.

Another current transducer uses separator marks such as start, stop, and parity bits between code words. Therefore, in a binary system which can read an 8-bit code word and uses three bits to accomplish synchronization, the maximum scale length would be $8*2^{(8-3)}$ (256) bit positions.

Yet another current transducer uses continuously varying wavelengths. This technique will work with a single track. However, the fine scale accuracy degrades as the wavelength increases toward the ends of the scale, since there are fewer fine scale marks under the read head. Additionally, the reduced spacing between the marks decreases the contrast between the phases. In this device, the scale length is limited by the read head length, the minimum spacing which allows marks to be accurately distinguished, and the minimum number of marks which are required under the read head for adequate accuracy.

SUMMARY OF THE INVENTION

There is thus a need for an absolute position transducer system that is insensitive to contaminants such as oil and ferromagnetic particles, suitable for a wide variety of applications, including very long measuring range applications and low-power applications, that is accurate, compact, and relatively inexpensive to manufacture compared to the conventional transducers described above, and that provides an absolute position output signal.

This invention provides an inductive absolute position transducer having a longer scale for a given read head length, or a smaller read head for a given scale length. The inductive absolute position transducer provides a longer maximum scale length than one using pseudo-random code tracks.

This invention separately provides an inductive absolute position transducer employing sequential codes, thereby simplifying decoding relative to pseudo-random code tracks.

This invention separately provides an inductive absolute position transducer using a simpler scale and read head design.

The absolute position transducer of this invention is useful for high accuracy applications such as linear or rotary encoders. This high accuracy is on the order of 0.1 micron for a one meter absolute scale.

In one embodiment of the inductive absolute position transducer of this invention, only three tracks are required, two analog fine scale tracks and an encoded numerical code track that defines the absolute coarse length of the transducer. The two fine scale tracks have different repeat lengths, such that the phase difference between the two fine wavelengths at a given position defines an intermediate wavelength much longer than either of the individual fine wavelengths. The same phase angle occurs on both scale tracks only once per intermediate wavelength. The code track is arranged so that each intermediate wavelength is aligned with one sequentially arranged code word or block of code words. Thus, no codes need to be avoided to prevent ambiguity. The read heads measure the phase difference between the fine wavelength scales. That difference in phase angle is then used to determine the starting point of the code word.

Alternatively, in place of one of the fine scale tracks, a medium wavelength scale track could be used to provide the intermediate wavelength. In this case, the intermediate wavelength is equal to the medium wavelength. However, in both cases, the code track provides the absolute position information used to determine which intermediate wavelength the position of the read head relative to the scale is in.

If 8-bit code track words increment sequentially from "00000000" through all 256 steps to "11111111" from left to right, the absolute position code word is determined by incrementing any bits determined from the differential phase angle to the left of the start of the code word by one and shifting them to the right end of the code word. If the code track decrements from left to right, the absolute position code word is determined by decrementing any bits determined from the differential phase angle to the left of the start of the code word by one before shifting them to the right end of the code word. Thus, for an absolute position transducer having an intermediate wavelength equal to the length of one 8-bit code word, the maximum scale length is 2048 (=8*28) bit positions, since both the appropriate code word and the position of the read head relative to the code word can be determined independently of the absolute position of the read head relative to the scale. Thus, the maximum scale length is a multiple of the maximum code track word length and the course wavelength, instead of the code track word length and the bit length, as in the '469 and '494 applications. Therefore, the scale length can be further increased without increasing the read head length, simply by increasing the number of bits in the code word.

In another embodiment of the code track, the scale length can be further increased by arranging the code track so that the intermediate wavelength contains P identical code words, where P is an integer greater than one. Thus, the maximum scale length described above would be increased by a factor of P bit positions since there would be P code words per intermediate wavelength.

The scale length can also be further increased using this technology without increasing the read head length, limited only by the reader accuracy and the number of digits in the code word. For example, the code track may use more than two value levels to create a base M code word, where M is greater than 2. In another embodiment, the scale length can be further increased by using two or more code tracks.

These and other features and advantages of this invention are described in or apparent from the following detailed description of the preferred embodiments.

BRIEF DESCRIPTION OF THE DRAWINGS

The preferred embodiments of this invention will be described in detail, with reference to the following figures, wherein:

FIG. 2 is a diagram showing the phase angle of a first fine track transducer over one intermediate wavelength of the transducer of FIG. 1 according to this invention;

FIG. 3 is a diagram showing the phase angle of a second fine track transducer over one intermediate wavelength of the transducer of FIG. 1 according to this invention;

FIG. 4 is a diagram showing the phase difference between the first and second fine track transducers over one intermediate wavelength of the transducer of FIG. 1 according to this invention;

FIG. 5 is a diagram showing the phase angle of an intermediate wavelength generated by the modified phase difference between the first and second fine wavelength transducers over one intermediate wavelength of the transducer of FIG. 1 according to this invention;

FIG. 7 is a diagram showing a sequential 8-bit code word pattern usable with the embodiment of the code track of the transducer of this invention shown in FIG. 1;

FIGS. 8 and 9 show a diagram of a sequential 6-bit code sequence pattern of a 24-bit code block according to a second embodiment of the code track of this invention;

FIG. 10 is a diagram showing a pair of sequential 6-bit code word patterns according to a third embodiment of the code track of this invention;

FIG. 12 is a diagram showing the phase angle of the fine wavelength track over one intermediate wavelength of the transducer of FIG. 11 according to this invention;

FIG. 13 is a diagram showing the phase angle of the code track over one intermediate wavelength of the transducer of FIG. 11 according to this invention;

FIG. 14 is a diagram showing the phase difference between the fine wavelength and the code tracks over one intermediate wavelength of the transducer of FIG. 11 according to this invention;

FIG. 15 is a diagram showing the phase angle of an intermediate wavelength generated by the corrected phase difference between the fine wavelength and the code tracks of the transducer of FIG. 11 according to this invention;

FIG. 16 is a plan view of a reduced-offset fine wavelength and code track scale according to a third embodiment of a compact, long-range absolute position transducer according to this invention;

FIG. 17 is a plan view of a read head of the third embodiment of the compact, long-range absolute position transducer according to this invention; and FIG. 18 is a plan view of the third embodiment of the compact, long-range absolute position transducer according to this invention.

DETAILED DESCRIPTION OF THE PREFERRED EMBODIMENTS

Although the structures and methods of this invention are readily applicable to optical, magnetic, capacitive, or inductive scales in both linear and rotary metrology, the following description and examples are directed to linear scales using inductive technology. One of ordinary skill in the art will readily appreciate how to apply the structures and methods disclosed herein to optical, magnetic and capacitive transducers. Thus, while the applicants intend for the scope of this application to cover such embodiments, to avoid unnecessary duplication, only inductive transducers will be used to describe this invention. That is, one of ordinary skill in this art would able to apply the techniques and methods described herein to optical, magnetic and capacitive transducers in a predictable manner. One of ordinary skill in this art would also be able to apply these teachings to optical, magnetic and capacitive transducers without undue experimentation. Thus, a detailed explanation of how the techniques and methods described herein can be applied to optical, magnetic and capacitive transducers is not necessary for an understanding of how the techniques and methods described herein can be applied to optical, magnetic and capacitive transducers and thus is omitted.

Figure 1:
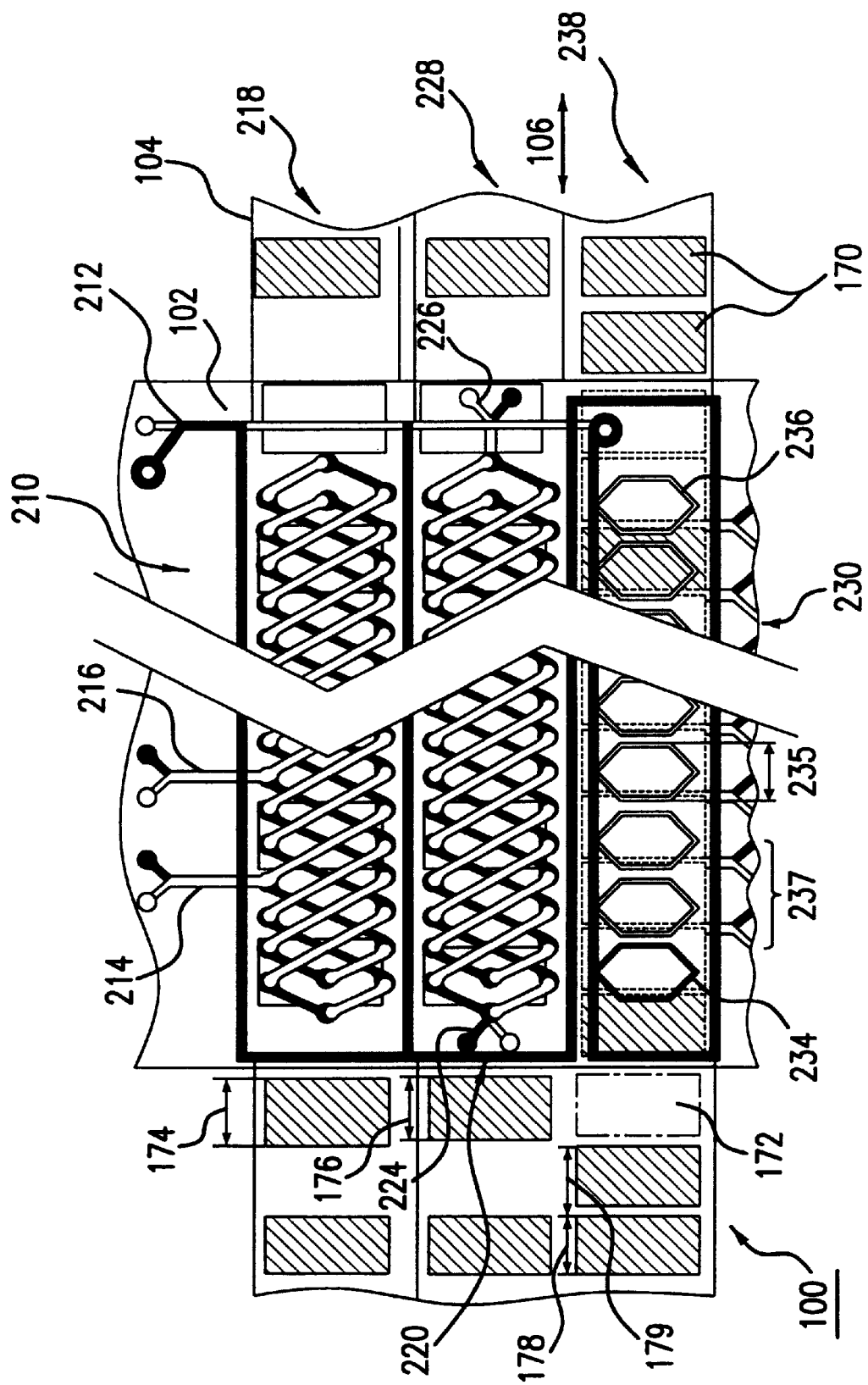
FIG. 1 is a plan view of one embodiment of a compact, long-range absolute position transducer according to the invention.

FIG. 1 shows one embodiment of a compact, long-range absolute position inductive transducer according to this invention. The general structure of the inductive transducer shown in FIG. 1, a detailed explanation of the inductive coupling between the read head and scale elements of the inductive transducer shown in FIG. 1, and a detailed description of the general operation of the inductive transducer shown in FIG. 1 are set forth in the incorporated '469 and '494 applications, as well as in copending U.S. patent application Ser. No. 08/912,567, filed Aug. 29, 1997, each herein incorporated by reference in their entireties. Because each of these incorporated references fully describe the general structure and operation of the inductive transducer shown in FIG. 1, the following detailed description of the compact, long-range absolute position transducer according to this invention omits such a description of the generalized structure and operation of the inductive transducer shown in FIG. 1.

FIG. 1 shows one preferred embodiment of the compact, long-range absolute position transducer according to this invention. For a given measurement resolution, the compact, long-range absolute position transducer of this invention can economically provide a much longer absolute position measurement range than that generally permitted by the conventional absolute position inductive transducers, such as those disclosed in the incorporated '469 and '494 applications.

As shown in FIG. 1, the compact, long-range absolute position inductive transducer 100 includes a read head 102 and a scale member 104. The read head 102 is movable along the scale 104 along a measuring axis 106. The compact, long-range absolute position inductive transducer 100 also includes first and second fine wavelength incremental inductive transducers 210 and 220 and a code transducer 230. The first and second fine wavelength transducers 210 and 220 and the code transducer 230 extend along the measuring axis 106. The first and second fine wavelength transducers 210 and 220 preferably have first and second fine wavelengths $\lambda_1$ and $\lambda_2$, respectively.

As shown in FIG. 1, the first fine wavelength transducer 210 includes a first receiver winding 214 and a second receiver winding 216 positioned on the read head 102 and arranged in quadrature (i.e., offset from each other by ¼ wavelength) along the measuring access 106. Similarly, the second fine wave length incremental inductive transducer 220 includes a first receiver winding 224 and a second receiver winding 226 positioned on the read head 102 and arranged in quadrature along the measuring access 106. Each of the receiver windings 214, 216, 224 and 226 includes an equal number of positive and negative loop portions.

Likewise, the binary code transducer 230 includes n+1 receiver windings, or balanced pairs, 237 positioned on the read head 102 and extending along the measuring axis 106, where n is the number of bits per code word. As shown in FIG. 1, each of the receiver windings, or balanced pairs, 237 of the code transducer 230 includes a positive loop portion 234 and a negative loop portion 236, where the positive loop portion 234 of one receiver winding, or balanced pairs, 237 overlaps the negative loop portion 236 of an adjacent receiver winding, or balanced pairs, 237.

The first and second fine wavelength transducers 210 and 220 and the code transducer 230 share a single transmitter winding 212, which is also formed on the read head 102. Alternatively, the read head 102 could include three separate transmitter windings (not shown), one for each transducer. The scale member 104 includes a first fine wavelength scale 218 of the first fine wavelength transducer 210 and a second fine wavelength scale 228 of the second fine wavelength transducer 220. The scale member 104 also includes a code track 238 of the code transducer 230. Each fine wavelength scale 218 and 228 includes a plurality of flux modulators 170. Similarly, each of the flux modulators 170 on the scales 218 and 228 has a length 174 and 176, respectively, measured along the measuring axis 106, that is equal to one-half of the corresponding first and second wavelengths $\lambda_1$ and $\lambda_2$. The flux modulators 170 can be either flux disrupters or flux enhancers, as described in the incorporated '469 and '494 applications.

Preferably, the first fine wavelength $\lambda_1$ is 2.54 mm and the wavelength $\lambda_2$ is 2.56 mm. Either of the first and second fine wavelength incremental inductive transducers 210 or 220 can be used to provide a fine wavelength incremental measurement. The second fine wavelength $\lambda_2$ (2.56 mm) is preferred for millimeter measurements because it allows for simple digital calculations. The first fine wavelength $\lambda_1$ (2.54 mm) is equal to 0.1 inches. Thus, it is used in inch measurements, because it allows for simple inch/millimeter conversion calculations.

The first and second fine wavelengths $\lambda_1$ and $\lambda_2$ are approximately equal to each other. Thus, the spatial phase difference between pairs of these wavelengths goes through a full 360° cycle over a spatial length, or intermediate wavelength, that is much longer than either of the individual first and second wavelengths $\lambda_1$ or $\lambda_2$. Accordingly, position output information from two transducers with different wavelengths, such as the two fine wavelength transducers 210 and 220, can be combined for long-range measurements.

The combined position information provides absolute position information, based on a spatial "phase relation" determination, over the intermediate wavelength. This intermediate wavelength corresponds to 360° of relative spatial phase shift, and is derived from the spatial wavelengths of the first and second fine wavelength transducers 210 and 220. This intermediate wavelength is much longer than the range of absolute measurement that could be achieved by either of the first and second fine wavelength transducers 210 or 220 alone.

As the spatial wavelengths of any two fine wavelength transducers become increasingly approximately equal to each other, the phase difference derived from signals from the two transducers goes through a full 360° cycle over an increasingly longer phase relation length, or intermediate wavelength. This corresponds to a larger absolute measuring range.

The permissible practical relationship between the first and second fine wavelengths $\lambda_1$ and $\lambda_2$ of the transducers 210 and 220, and thus intermediate wavelength, is dependent on the measurement accuracy for each of the wavelengths/transducers. A high measurement accuracy for an individual transducer indicates that positions can be accurately determined to a resolution that is a small part of the transducer wavelength.

The phase difference between the first and second fine wavelengths $\lambda_1$ and $\lambda_2$ when equal to 2.54 mm and 2.56 mm, respectively, provides an effective intermediate wavelength of 325.12 mm. Thus, the Coarse/Fine ratio is approximately 128/1. This wavelength ratio provides an adequate safety margin relative to the nominal accuracy and interpolation ratio of 256/1 expected for each of the first and second fine wavelength transducers 210 and 220, and the corresponding first and second fine wavelengths $\lambda_1$ and $\lambda_2$. The wavelength ratios can be increased depending on system design tolerances and allowable costs. However, this often results in a greater risk of errors causing incorrect absolute measurement readings. It should be appreciated that, to ensure the inductive absolute position transducer has a sufficient measuring range, the Coarse/Fine ratio is preferably at least 100. The following quantitative description summarizes the preferred design guidelines corresponding to the fine (millimeters and inches) and coarse operating modes preferred in the compact, long-range absolute position transducer of this invention.

Alternatively, in place of one of the fine scale transducers 210 and 220, a medium wavelength scale transducer having a wavelength equal to the intermediate wavelength could be used to provide the intermediate wavelength.

As noted above, each transducer 210 and 220 uses two receiver windings 214 and 216, and 224 and 226, respectively. Because the first and second receiver windings 214 and 216, and 224 and 226 are arranged in quadrature, the signals output from the first and second receiver windings 214 and 216, and 224 and 226 are spatially 90° out of phase. The relation between the signals from the two receiver windings allows the direction of movement to be determined and allows an unambiguous fine position measurement to be determined anywhere within a fine wavelength.

In the compact, long-range inductive absolute position transducer 100 shown in FIG. 1, the signal amplitudes of the receiver windings follow a periodic function as read head 102 moves along the scale 104 along the measuring axis 106. The linear and phase positions x and $\phi_n$, respectively, within one local wavelength of the scale 104 relative to the corresponding receiver windings are obtained as:

$$x = \tan^{-1}(s1/s2) \cdot (\lambda_n/2\pi)$$

$$\phi_{1n} = \tan^{-1}(s1/s2)$$

where:
x is the linear position within one fine wavelength;

$\phi_{1n}$ is the spatial phase position, where n=1 or 2 for first or second fine wavelength transducer 210 or 220, respectively;

s1 and s2 are the amplitudes of the output signals from the corresponding first and second receiver windings 214 and 216, and 224 and 226; and $\lambda_n$ is the corresponding wavelength.

The $\tan^{-1}$ function returns a value between 0 and $2\pi$, by using the signal polarity of the s1 and s2 signals to identify the appropriate "quadrant" of the wavelength that corresponds to the signals s1 and s2.

The first and second fine wavelength transducers 210 and 220 can, to some degree, parasitically couple. This may cause errors in the receiver output signals from the transducers. To reduce parasitic coupling between the transducers 210 and 220, the two wavelengths may be placed a maximal distance apart from each other within the compact, long-range absolute position transducer 100.

The code scale 238 shown in FIG. 1 is a binary code scale having a pattern of flux modulators 170 and spaces 172 arranged along the measuring axis 106. The flux modulators 170 can be either flux disrupters or flux enhancers, as described in the incorporated '469 and '494 applications. Each set of adjacent flux modulators 170 and the spaces 172 defines one of a sequential series of unique multi-bit binary code words. The number of binary code words will depend on the number of bits in the binary code words and the design rules for the code words. These design rules will be described in greater detail below.

As shown in FIG. 1, for the code scale 238, each flux modulator 170 and each space 172 occupies a length 178 along the measuring axis 106. In particular, for the code scale 238, the length 178 of the flux modulators 170 is slightly less than the edge-to-edge distance 179. This provides a narrow insulative gap surrounding and defining the flux modulators 170 when they are adjacent to one another. The edge-to-edge length 179 is also equal to a length 235 of each receiver loop 234 and 236 of the code transducer 230. It should also be appreciated that only a portion of the scale member 104, and thus only a portion of the binary code scale 238, is shown in FIG. 1.

As shown in FIG. 1, each first polarity loop 234 is connected in series to a second polarity loop 236. Thus, the pairs of adjacent first and second polarity loops 234 and 236 form a plurality of balanced loop pairs 237. Each of the balanced loop pairs 237 nominally produces no output signal if there are no flux modulators 170 present to modulate the magnetic flux generated by the transmitter winding 212.

When both the first polarity loop 234 and the second polarity loop 236 of a balanced loop pair 237 are positioned above a pair of spaces 172 or a pair of flux modulators 170, the induced electromagnetic flux (EMF) in each of the first and second polarity loops 234 and 236 is nominally the same. Thus, the net voltage amplitude of the signal output from the balanced loop pair 237 is nominally zero. This holds true for any symmetrical arrangement of a balanced loop pair 237 with respect to the flux modulators 170 or spaces 172.

In contrast, assuming the flux modulators 170 are disrupter-type elements, the first polarity loops 234 are positive polarity loops, and the second polarity loops 236 are negative polarity loops, when a positive polarity loop 234 is positioned over a space 172 of a balanced loop pair 237 and the negative polarity loop 236 of that balanced loop pair 237 is positioned over a flux disrupter 170, that balanced loop pair 237 outputs a positive amplitude voltage signal. That is, the EMF induced in the positive loop 234 is not disrupted.

However, the EMF induced in the negative polarity loop 236 is disrupted. Thus, a net positive EMF is induced in the balanced loop pair 237. The balanced loop pair 237 thus outputs a positive amplitude voltage signal.

Furthermore, if the positive polarity loop 234 of a balanced loop pair 237 is positioned over a flux disrupter 170, while the negative polarity loop 236 of the balanced loop pair 237 is positioned over a space 172, the balanced loop pair 237 outputs a net negative amplitude voltage signal. That is, the EMF induced in the negative polarity loop 236 would not be disrupted, while the EMF induced in the positive polarity loop 234 would be disrupted. Thus, a net negative EMF is induced in the balanced loop pair 237. The balanced loop pair 237 thus outputs a negative voltage amplitude signal.

It should be appreciated that, if the flux modulators 170 are enhancer-type elements instead of flux disrupters, or the polarities of the first polarity loops 234 and the second polarity loops 236 are reversed, the voltage amplitudes are also reversed. Of course, if both of these changes were made at the same time, the voltage amplitudes would remain the same.

Thus, when a space 172 is adjacent to a flux modulator 170, the output from the balanced loop pair 237 lying above that pair of a space 172 and an adjacent flux modulator 170 is either a positive voltage or a negative voltage. Both of these voltages are defined as logical "1" values. Specifically, each logical "1" value corresponds to a transition along the code scale 238 between a flux modulator 170 and a space 172. Similarly, each logical "0" value corresponds to the lack of a transition in the code scale 238.

Thus, each set of seven adjacent pairs of the flux modulators 170 and the spaces 172 of the binary code scale 238 define a 7-bit binary code word. That is, eight adjacent flux modulators 170 and/or spaces 172 form 7 pairs of adjacent elements, or 7 code pairs. Each of the seven code pairs of adjacent elements is sensed by one of the seven balanced loop pairs 237 of the binary code transducer 230.

It should also be appreciated that the binary code transducer 230 can include any number of balanced loop pairs 237. Furthermore, each additional one of the balanced loop pairs 237 of the binary code transducer 230 doubles the number of available code words that can be encoded in the sequential binary code scale 238. It should also be appreciated that, by using the balanced loop pairs 237, the binary code transducer 230 does not have to be moved along the binary code scale 238 to read a single binary code word.

It should also be appreciated that, because the balanced pairs 237 detect the presence or absence of transitions, space need not be left between adjacent elements in the binary code scale 238. That is, alternatively, two flux modulators 170 can be placed directly next to each other, without any intervening space. Thus, in this alternative embodiment, the distance 178 would equal the distance 179. Further, in this alternative embodiment, the binary code scale 238 of the binary code transducer 230 would advantageously use a maximal density of the flux modulators 170 and the spaces 172. Also, the code track 230 and the read head 202 could employ substantially the entire unit distance 179 for each conductive element 170 to efficiently provide the strongest receiver output signal from the available space.

The compact, long-range absolute position transducer 100 uses three tracks, two fine wavelength scale tracks and a code track with a series of sequential discrete code words, as described above. The two fine wavelength scales have different repeat lengths such that the same phase angle occurs on both fine scales only once per intermediate wavelength. In addition, one intermediate wavelength is preferably aligned with either one code word or one code block that contains an integer number of identical code words.

The phase angle of the read head 102 relative to the intermediate wavelength is measured by well-known devices and methods, as described above and in the incorporated references, such as two windings for each fine wavelength scale 218 and 228 spaced apart such that they produce signals in quadrature (sine and cosine). The phase angle is equal to the arctangent of the sine/cosine signals for each scale. Similar equations can be derived for other spacing of the read head windings, or for more than two windings. The windings are preferably spaced at $180°/N$, where N is the number of windings.

The circuitry and the signal processing steps associated with the fine wavelength transducers and code transducer are essentially the same as those disclosed in the incorporated '469 and '494 applications.

For illustration purposes and to facilitate a better understanding of this invention, FIG. 2 shows the phase angle versus position for the first fine wavelength scale having twenty-five fine wavelengths between points A and B, which define one intermediate wavelength for this transducer. FIG. 3 shows the phase angle for a second fine wavelength scale having twenty-four wavelengths between points A and B. The fine wavelength scales are aligned with each other at points A and B. The distance from point A to point B thus represents one intermediate wavelength. The phase difference between the two fine wavelength scale phase angles is shown in FIG. 4. The difference is discontinuous, but can be modified to form a continuous phase relationship between the two fine wavelength scales by adding a value representative of 360° to any negative values.

FIG. 5 shows the modified phase difference, which is a linear function of the position of the read head relative to the intermediate wavelength. Since each intermediate wavelength is aligned with one code word or one code block, the phase difference can be used to determine the position of the read head relative to the start of the code word, or code block. Therefore, the phase difference is an unambiguous measure of the position of the read head relative to the start of the code word independently of the relative position of the read head relative to the scale. It should be appreciated that having the start of the code word aligned with the points at which the two fine wavelength scale patterns are aligned is convenient, but not required. In order to avoid scanning the read head over a portion of the scale to determine the absolute position, the read head must have a sufficient length and number of receiver windings to read at least one full code word at a time.

Figure 6A:
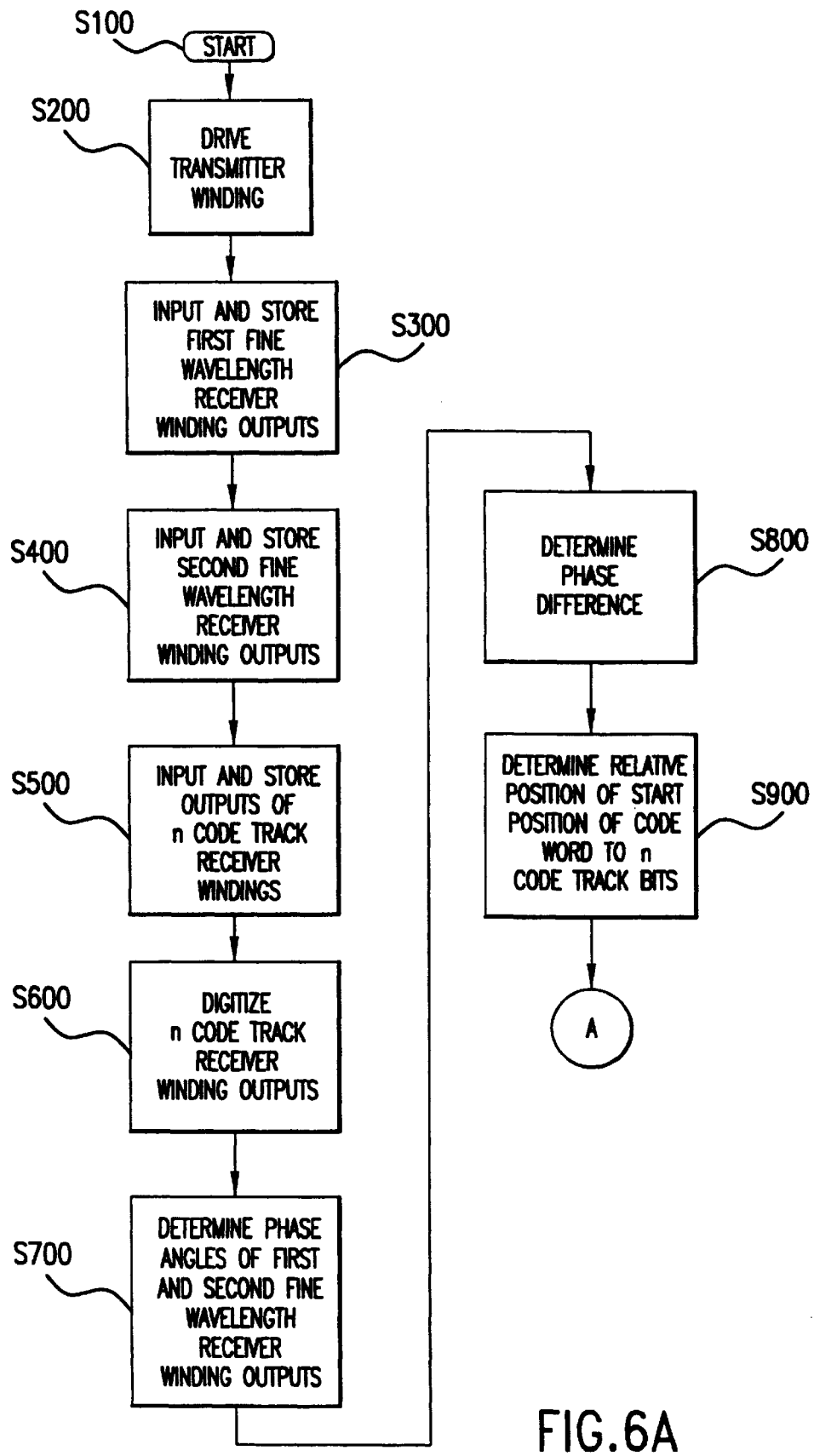
FIGS. 6A and 6B are a flowchart outlining a method of determining the absolute position of the read head of the transducer according to this invention.
Figure 6B:
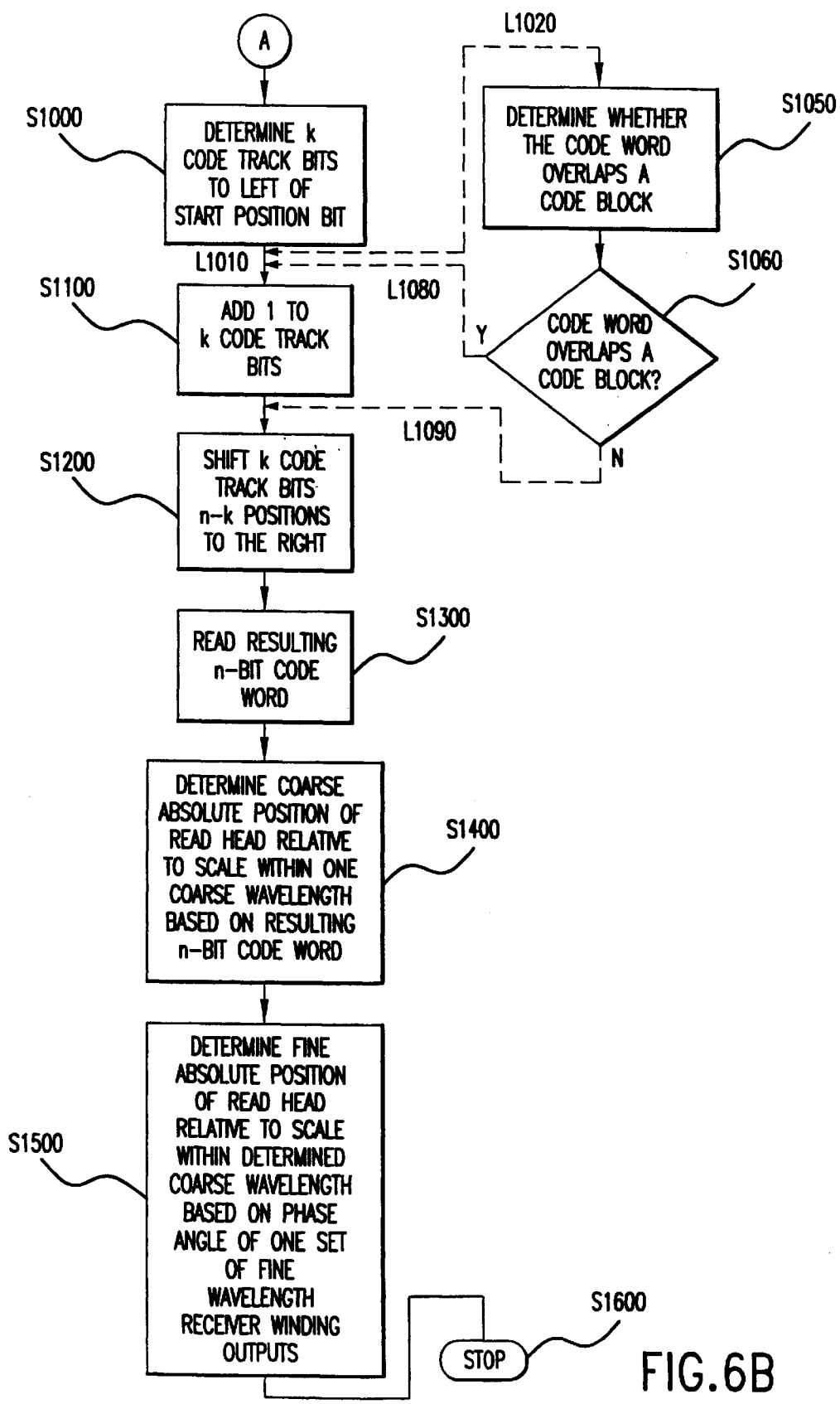

FIGS. 6A and 6B outline a method for determining the absolute position of the read head of the compact, long-range absolute position transducer of this invention. Beginning in step S100, control continues to step S200, where the transmitter winding is driven. Then, in step S300, the outputs of the first fine wavelength receiver windings are input and stored. Next, in step S400, the outputs of the second fine wavelength receiver windings are input and stored. Then, in step S500, the outputs of n code track receiver windings are input and stored. The variable "n" represents the number of bits in a code word. Then, in step S600, the "n" outputs of the code track receiver windings are digitized.

Next, in step S700, the phase angles of the first and second fine wavelength receiver windings are determined. Then, in step S800, the phase difference of the outputs of the first and second fine wavelength receiver windings is determined. Next, in step S900, the relative position of the start position of a code word to the n code track bits is determined based on the determined phase difference.

Then, in step S1000, the number k of code track bits to the left of the start position bit is determined. Next, in step S1100, the binary sequence of k code track bits is incremented by one. Then, in step S1200, the rightmost k bits of the incremented binary sequence are shifted n-k positions to the right.

Next, in step S1300, the resulting n-bit code word is read. Then, in step S1400, the coarse absolute position of the read head relative to the scale is determined within one intermediate wavelength, based on the resulting n-bit code word. Next, in step S1500, the fine absolute position of the read head relative to the scale is determined within the determined intermediate wavelength based on the phase angle of one set of fine wavelength receiver winding outputs. Then, in step 1600, the absolute position measuring process stops.

In another preferred embodiment of this invention, the long-range absolute position transducer 100 can include a code track having code blocks, where each code block includes a plurality of identical code words. FIG. 6B outlines one method for implementing this feature. If the code block feature is implemented, step S1050 (shown in broken lines in FIG. 6B) will be included after the number k of code track bits to the left of the start position are determined. In this case, instead of following control path L1010 to step S1100 after the number k of code track bits to the left of the start position are determined in step S 1000, control path L1 020, indicated by the broken line, is followed to step S1050. In step S1050, it is determined whether the code word seen by the read head overlaps a code block. Then, in step S11060, if it is determined that the code word overlaps a code block, the process continues on control path L1080 to step S1100. Steps S1100–S1600 are then executed as described above.

In step S1060, if it is determined that the code word does not overlap a code block, control jumps to step S1200 along path L1090. Steps S1200–S1600 are then executed as described above.

Figures 7, 8, 9, 10:
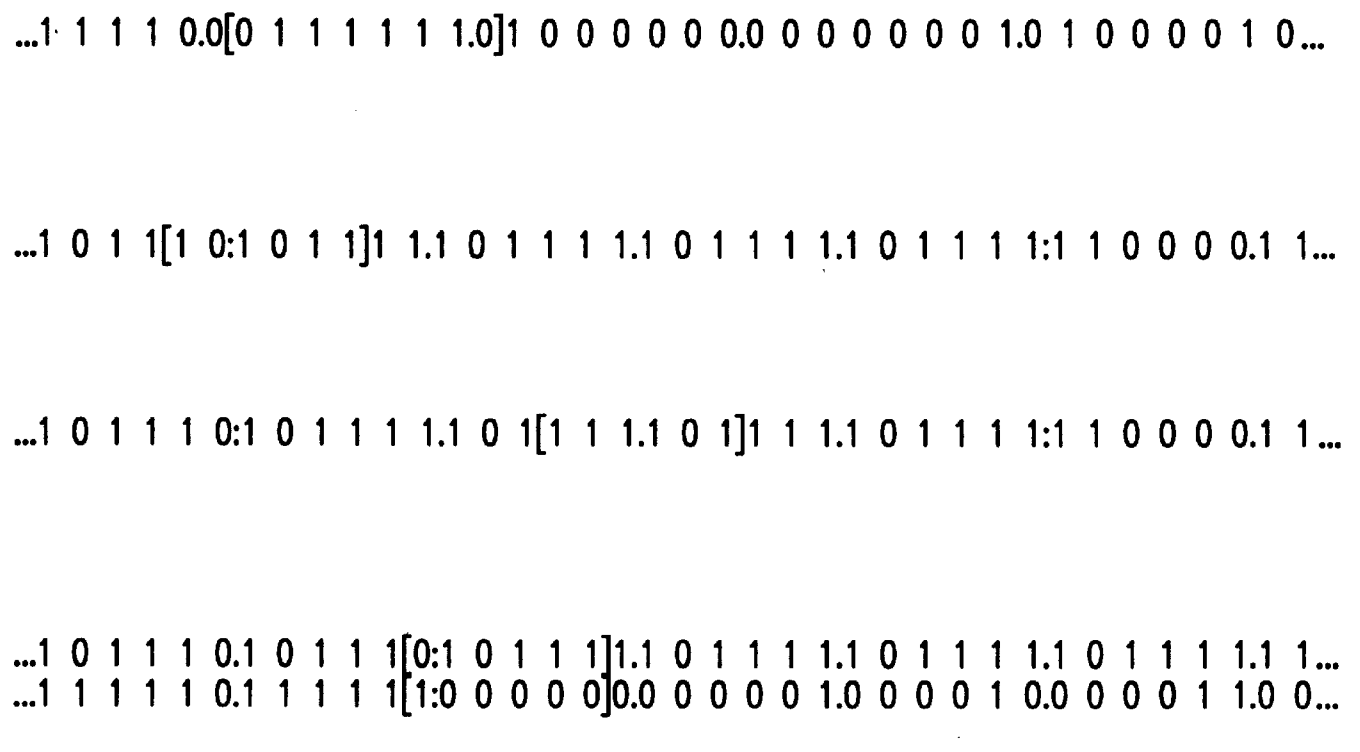

The code track 238 can be arranged in various configurations, depending on the desired scale length and accuracy. FIG. 7 shows an example of a first embodiment of the arrangement of the code track of the compact, long-range absolute position transducer of the invention. In FIG. 7, 8-bit binary code track words increment sequentially from "00000000" through all 256 steps to "11111111" from left to right. In this embodiment, the most significant bit is on the left and the least significant bit is on the right. Additionally, in FIG. 7, the width of each "bit position" of the code track transducer along the measuring axis is equal to either one-half of, or one whole, wavelength of one of the fine wavelength transducers, depending on the structure of the transducer, and the width of the eight bit positions that form a unique code word is equal to the intermediate wavelength. A "bit position" is the position on the code track scale that is defined to correspond to the position of the receiver winding given by an output based on the flux modulator or space occupying that bit position, and thus to the digitized output of one of the receiver windings of the code track read head. Thus, as shown in FIG. 1, each "bit position" could be defined to correspond to the left-hand loop of each receiver winding, or alternatively, the right-hand loop of each receiver winding. Because the positions of the right or left hand loops corresponding to each bit position on the read head is known, the position of the read head relative to the bit position, and thus to the scale, can be determined.

FIGS. 7–10 show only a portion of the sequence of code words. In FIG. 7, the start of each code word is shown by a period (.). Binary values are assigned to each bit position, and the bit positions underlying the receiver windings of the code track read head are enclosed in brackets ([ ]). Ellipses ( . . . ) are used to indicate the continuation of the sequential series.

The sequence of digitized outputs of the receiver windings of the code track read head shown in FIG. 7, "01111110" is not unique. For example, this sequence will also occur when the read head is shifted 9 bit positions to the left, as well as at several other positions on the scale. However, the start position for this code word is easy to find. The sequence of digitized outputs from the receiver windings of the code track read head occurring to the left of the start position "0111111" is determined and the resulting binary number "0111111" is incremented by one to obtain a new binary number "1000000". In the event that the incrementing results in a new binary number containing more bits than the previous binary number, the most significant bit of the new binary number is truncated. Then, this resulting sequence of bits is combined with the original sequence of digitized outputs of the receiver windings of the code track read head occurring to the right of the start position. In particular, the resulting sequence is combined with the original sequence so that the resulting sequence is positioned to the right of the original sequence to determine the code word input by the code track receiver windings. The determined code word indicates the coarse absolute position of the read head. That is, each code word, whether it appears once per intermediate wavelength, or multiple times per intermediate wavelength, uniquely identifies a particular intermediate wavelength.

Additionally, as shown in FIG. 7, when each code word appears once per intermediate wavelength, the position of the code track read head relative to the start position also indicates which fine wavelength the read head is positioned relative to. That is, in this case, the relative position of the start position within the sensed binary sequence indicates the absolute position of the read head to the scale to a "medium" resolution. This medium resolution indicates which fine wavelength of the identified intermediate wavelength the read head is positioned relative to. Then, by reading the quadrature output of one of the fine wavelength receiver windings, the fme absolute position within the identified fine wavelength can be determined. It should also be appreciated that the phase difference, in addition to allowing the position of the start position within the sensed binary sequence to be determined, can also be used to determine which fme wavelength of the identified intermediate wavelength the read head is positioned relative to. Furthermore, as described below, when there are multiple instances of a code word within an intermediate wavelength, the phase difference must be used to identify the particular fine wavelength.

If the code track read head was aligned with any of the next six bit positions of the code scale which are not aligned with the code word, to generate the six binary sequences "111111.01", "11111.010", "1111.0100", "111.01000", "11.010000", and "1.0100000", the same code word "01000000" would still be determined using this procedure. The next position of the read head relative to the code scale, "0.01000000", needs no correction, since it is aligned with the start position.

From this example, it is clear that each of the 256 unique code words can be reconstructed from any position of the read head relative to the code scale, as long as at least 8 bits can be read and the start position determined. It should also be understood that this method applies to more or fewer than 8 digits, and to digit sequences having bases above base 2 if more than two levels can be distinguished by, for example, magnitude, size, height, width, depth, position, intensity, or other properties. Alternatively, the word at the left end of the read head can be reconstructed by subtracting one from the previously-determined digit sequences. It should be appreciated that other algorithms can also be used. The most significant bit could be at the right end of the word and the least significant bit at the left, as long as incrementing is replaced with decrementing and left shifting is replaced with right shifting.

In a second embodiment of the arrangement of the code track of the compact, long-range absolute position transducer of this invention, the code track can synchronize with the phase of the intermediate scale only every P code word lengths, where P is an integer greater than one. In this case, each code word is repeated identically P times as a code block within each intermediate wavelength before the code word is incremented, and repeated for the next P code words of the code block for the subsequent intermediate wavelength. In this case, the bit positions to the left of the start position of the code word only need to be incremented, or decremented, before being shifted to the appropriate end of the code word, when the start position of the code word is also the start position of the code block.

FIGS. 8 and 9 illustrate examples of this second embodiment. In FIG. 8, each 6-bit code track word is repeated four times in each code block for a particular intermediate wavelength before the code word is incremented. The code word appearing in the code blocks is incremented sequentially from "000000" through all 64 steps to "111111" from left to right. In each code word, the most significant bit is on the left and the least significant bit is on the right. The start of each code block is shown by a colon (:), and the start of each code word is shown by a period (.). Binary values are assigned to each bit position, and the bit positions underlying the receiver windings of the code track read head are enclosed in brackets ([ ]). Ellipses ( . . . ) are used to indicate the continuation of the sequential series.

In the example of FIG. 8, the code track read head overlaps the start position of a code word that coincides with the start position of a code block. However, the start position for this code word is easy to find. The sequence of digitized outputs from the receiver windings of the code track read head occurring to the left of the start position "10" is determined and the resulting binary number "10" is incremented by one to obtain a new binary number "11". Then, this resulting sequence of bits "11" is combined with the original sequence "1011" of digitized outputs of the receiver windings of the code track read head occurring to the right of the start position. In particular, the resulting sequence is combined with the original sequence so that the resulting sequence is positioned to the right of the original sequence to determine the code word "101111" input by the code track receiver windings. The determined code word indicates the coarse absolute position of the read head.

In FIG. 9, the code track read head overlaps the start position of a code word that does not coincide with the start position of a code block. Thus, after the start position is determined, the sequence of digitized outputs from the receiver windings of the code track read head occurring to the left of the start position "111" is determined. The resulting binary number "111" is not incremented, but is simply combined with the original sequence "101" of digitized outputs of the receiver windings of the code track read head occurring to the right of the start position. In particular, the resulting sequence is combined with the original sequence so that the resulting sequence is positioned to the right of the original sequence to determine the code word input by the code track receiver windings. The determined code word "101111" indicates the coarse absolute position of the read head.

In a third embodiment of the arrangement of the code track of the compact, long-range absolute position transducer of the invention, a second code track is added to double the number of code bits and square the maximum scale length in code bits. Adding a third code track would cube the maximum scale length in code bits while still maintaining a compact read head. Thus, absolute transducers hundreds of kilometers in length with micrometer resolution are possible.

FIG. 10 shows the third embodiment of the code track scale. This embodiment includes a 12-bit code word formed from two 6-bit code word tracks. In FIG. 10, the first (lower) code track represents the six least significant bits of the 12-bit code word, and the second (upper) code track represents the six most significant bits of the 12-bit code word. In each 6-bit code word and the 12-bit code word, the most significant bit is on the left and the least significant bit is on the right.

In FIG. 10, the first code track increments sequentially from "000000" through all 64 steps to "111111" from left to right, while the second code track remains unchanged. The second code track is then incremented by one and the first code track again increments sequentially from "000000" through all 64 steps to "111111" from left to right. Thus the maximum number of bit positions is 4096 (=$64^2$). The point of incrementing the second code track is shown by a colon (:), and the start of each pair of code words is shown by a period (.). Binary values are assigned to each bit position, and the bit positions underlying the receiver windings of the code track read head are enclosed in brackets ([ ]). Ellipses ( . . . ) are used to indicate the continuation of the sequential series.

In FIG. 10, the code track read head overlaps the start position of a code word that coincides with the position where the first code track reaches the maximum binary value "111111" and the second code track is incremented. However, the start position for this code word is easy to find. The complete binary sequence of digitized outputs from the receiver windings of the first and second code track read heads is "010111100000". This sequence is then separated into two binary sequences, one sequence from each code track read head.

The sequence of digitized outputs from the receiver windings of the first code track read head occurring to the left of the start position "1" is determined and the resulting binary number "1" is incremented by one to obtain a new binary number "10". Since the new binary number "10" contains a greater number of bits than the original sequence of outputs to the left of the start position, the most significant bit "1" of the new binary number is truncated, and the resulting sequence of bits "0" is combined with the original sequence "00000" of digitized outputs of the receiver windings of the code track read head occurring to the right of the start position. In particular, the resulting sequence is combined with the original sequence so that the resulting sequence is positioned to the right of the original sequence to determine the code word "000000" input by the first code track receiver windings.

Since the code word "000000" indicates that the second code track needs to be incremented, the sequence of digitized outputs from the receiver windings of the second code track read head occurring to the left of the start position "0" is determined and the resulting binary number "0" is incremented by one to obtain a new binary number "1". The resulting sequence of bits "1" is combined with the original sequence "10111" of digitized outputs of the receiver windings of the code track read head occurring to the right of the start position. In particular, the resulting sequence is combined with the original sequence so that the resulting sequence is positioned to the right of the original sequence to determine the code word "101111" input by the second code track receiver windings. The code words input by the first and second receiver windings are then combined to form the code word "101111000000" indicating the coarse absolute position of the read head.

Figure 11:
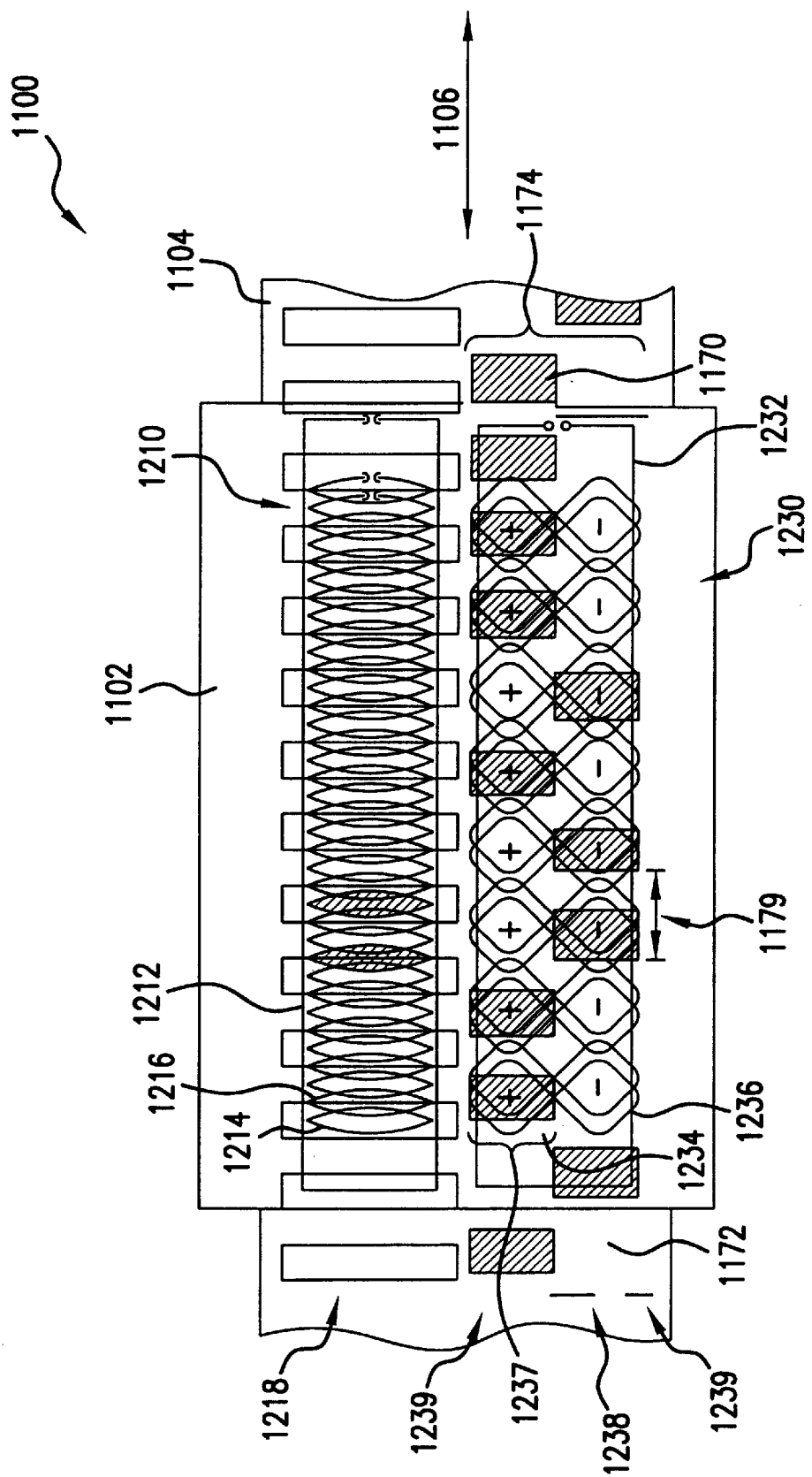
FIG. 11 is a plan view of a second embodiment of a compact, long-range absolute position transducer according to this invention.

FIG. 11 shows a second embodiment of the compact, long-range absolute position transducer 1100 of the invention. In particular, FIG. 11 shows a read head 1102 and a scale member 1104 in an overlap relationship. The second embodiment of the compact, long-range absolute transducer 1100 of the invention uses only two scales, a fine wavelength scale 1218 of a fine wavelength transducer 1210 and a code track scale 1238 of a code track transducer 1230.

In the second embodiment of the inductive absolute position transducer 1100, as shown in FIG. 11, the code track transducer 1230 has two windings in quadrature, each winding containing eight balanced pairs 1237. The plurality of balanced pairs 1237 are surrounded by a transmitter winding 1232, while the transmitter winding 1212 surrounds only the receiver windings 1214 and 1216 of the fine wavelength transducer 1210. This is in contrast to the first embodiment, which uses a common transmitter winding for all three transducers.

Each balanced pair 1237 has a first positive polarity loop 1234 and a second negative polarity loop 1236, similarly to the first embodiment. However, in this second embodiment, the first and second polarity loops 1234 and 1236, rather than being aligned along the measuring axis 1106, as in the previous embodiment, are aligned perpendicular to the measuring axis 1106.

The binary code transducer 1230 of the second embodiment has scale elements 1174 comprising two parallel portions formed on the scale member 1104. The binary code scale 1238 includes an upper portion 1239 and a lower portion 1239'. The two portions are arranged along the measuring axis 1106. The upper and lower portions 1239 and 1239' each include a plurality of the scale elements 1174, including a plurality of flux modulators 1170 and a plurality of spaces 1172. Each of the scale elements 1174 has a length equal to one-half of the edge-to-edge distance 1179.

A positive voltage corresponds to a logical "1" value and a negative voltage corresponds to a logical "0" value. When a positive polarity loop 1234 lies over a space 1172 and a negative polarity loop 1236 lies over a flux disrupter 1170, the balanced pair 1237 outputs a positive amplitude signal (i.e., a logical "1"). Alternately, when a positive polarity loop 1234 lies over a flux disrupter 1170 and a negative polarity loop 1236 lies over a space 1172, the balanced pair 1237 outputs a negative amplitude signal (i.e., a logical "0"). Thus, the voltage difference between the logical "1" and the logical "0" is potentially twice that of the binary code transducer 230 of the first embodiment, improving the ability to distinguish logical "1"s from logical "0"s.

Furthermore, in this second embodiment, as in the first embodiment, the spaces 1172 can be replaced by flux enhancers, assuming the flux modulators 1170 are flux disrupters. In this case, the net positive and negative signal amplitudes generated in the balanced pairs 1237 would again be greater than if spaces 1172 were used. This further increases the voltage difference between the logical "1" and the logical "0," further improving the ability to distinguish logical "1"s from logical "0"s.

In this second embodiment of the compact, long-range absolute transducer 1100 of the invention, the code track transducer 1230 is used for two purposes: 1) to generate an intermediate wavelength by computing the phase difference between the phase angles of a fine wavelength transducer 1210 and a fine wavelength output of the code track transducer 1230, and 2) to generate a sequential code, such as one of the sequential codes described above with respect to FIGS. 7–10. Therefore, the compact, long-range absolute position transducer 1100 needs only one fine wavelength transducer 1210 and the code track transducer 1230. Thus, the size of a read head 1102 of the compact, long-range absolute position transducer 1100 is further reduced.

The fine wavelength transducer 1210 and code track transducer 1230 have different repeat lengths such that the same phase angle occurs on the outputs of the transducers 1210 and 1230 only once per intermediate wavelength, similar to the two fine wavelength transducers 210 and 220 of the compact, long-range absolute position transducer 100 shown in FIG. 1. In addition, one intermediate wavelength is preferably aligned with either one code word or one code block that contains an integer number of identical code words. Alignment of the intermediate wavelength with the fine wavelength and code track is convenient but is not a requirement of the invention.

The phase angle of the read head relative to the fine wavelength is measured by well-known means, as described above. For example, two windings for the fine wavelength scale 1218 are spaced apart such that they produce signals in quadrature. In addition, two or more sensors are used for the code track 1238 to allow similar measurement of the phase angle of the read head pattern relative to the code track 1238. Although any displacement of these sensor patterns other that 0° or integer multiples of 180° can be used, the windings are preferably spaced at 180°/N, where N is the number of windings. The preferred spacing is 90° for two sensors (producing signals in quadrature), 60° for three sensors, etc. For signals in quadrature, the phase angle is equal to the arctangent of the sine/cosine signals for each scale. Similar equations can be derived for the other spacings of the read head windings and/or for more than two windings.

For illustration purposes and to facilitate a better understanding of this invention, FIG. 12 shows the phase angle versus position for the fine wavelength scale having nine wavelengths between points A and B, which define one intermediate wavelength for this transducer. FIG. 13 shows the phase angle for eight code track cycles between points A and B. The fine wavelength scale and the code track cycles are aligned with each other at points A and B. The distance from A to B thus represents one intermediate wavelength. The phase difference between the two phase angles is shown in FIG. 14. The difference is discontinuous, but can be modified by adding a value representative of 360° to any negative values.

FIG. 15 shows the modified phase difference, which is a linear function of the position of the read head relative to the intermediate wavelength. Since each intermediate wavelength is aligned with one code word or one code block, as described above, the phase difference can be used to determine the position of the read head relative to the start of the code word, or code block. Therefore, the phase difference is an unambiguous measure of the position of the read head relative to the start of the code word independently of the position of the read head relative to the scale. It should be appreciated that having the start of the code word aligned with the points at which the fine and code track scale patterns are aligned is convenient, but is not required.

It should be appreciated that the embodiments of the arrangement of the code track, described above with respect to the first embodiment of the compact, long-range absolute position transducer of the invention, can equally be used in this second embodiment of the compact, long-range absolute position transducer of the invention. Further, the process for determining the absolution position of the read head shown in FIG. 6, is equally applicable to this second embodiment of the compact, long-range absolute position transducer of the invention. Thus, the second embodiment of the compact, long-range absolute position transducer of the invention provides all of the advantages of the first embodiment, and does so with a smaller read head due to eliminating the need for two fine wavelength transducers.

FIGS. 16–18 show a third embodiment of the compact, long-range absolute position transducer of this invention. In this third embodiment of the compact, long-range absolute position transducer of this invention, the compact, long-range absolute position transducer 2200 is configured as a reduced-offset position transducer, such as the reduced-offset position transducers described in U.S. patent application Ser. No. 08/834,432, filed Apr. 16, 1997, which is herein incorporated by reference in its entirety.

In particular, FIG. 16 shows a first preferred embodiment of the reduced-offset scale 2210 of the transducer 2200. As shown in FIG. 16, the reduced-offset scale 2210 includes a first closed-loop coupling loop 2212 interleaved with a second closed-loop coupling loop 2216. Each of the coupling loops 2212 and 2216 is electrically isolated from the other of the coupling loops 2212 and 2216.

The first coupling loop 2212 includes a first loop portion 2213 and a plurality of second loop portions 2214 connected by connecting conductors 2215. Similarly, the second coupling loop 2216 includes a first loop portion 2217 and a plurality of second loop portions 2218 connected by connecting conductors 2219.

In the first coupling loop 2212, the first loop portion 2213 is arranged along one lateral edge of the scale 2210 and the second loop portions 2214 are arranged along the center of the scale 2210 and are arrayed along the measuring axis. The connecting conductors 2215 extend perpendicularly to the measuring axis 2114 to connect the first loop portion 2213 to the second loop portions 2214.

Similarly, in the second coupling loop 2216, the first loop portion 2217 is arranged along a second lateral edge of the scale 2210 and the second loop portions 2218 are arranged along the center of the scale 2210, arrayed along the measuring axis, and interleaved with the second loop portions 2214 of first coupling loop 2212. The connecting conductors 2219 extend generally perpendicularly to the measuring axis 2106 to connect the first loop portion 2217 to the second loop portions 2218. Each of the first loop portions 2213 and 2217 also includes flux modulators 2170 for generating the sequence of code words or code blocks of the code track.

As shown in FIG. 17, the read head 2220 of the transducer 2200 includes a transmitter winding 2222 having a first transmitter winding portion 2223A and a second transmitter winding portion 2223B. As shown in FIG. 17, the first transmitter winding portion 2223A is provided at a first lateral edge of the read head 2220, while the second transmitter winding portion 2223B is provided at the other lateral edge of the read head 2220. Each of the first and second transmitter winding portions 2223A and 2223B have the same long dimension extending along a measuring axis 2106. Furthermore, each of the first and second transmitter winding portions 2223A and 2223B have a short dimension that extends in a direction perpendicular to the measuring axis 2106.

The terminals 2222A and 2222B of the transmitter winding 2222 shown in FIG. 17 are connected to a transmitter drive signal generator (not shown). The transmitter drive signal generator outputs a time-varying drive signal to the transmitter winding terminal 2222A. Thus, a time-varying current flows through the transmitter winding 2222 from the transmitter winding terminal 2222A to the transmitter terminal 2222B.

In response, the first transmitter winding portion 2223A generates a first changing magnetic field having a first direction while the second transmitter winding portion 2223B generates a second magnetic field in a second direction that is opposite to the first direction. This second magnetic field has a field strength that is equal to a field strength of the first magnetic field generated by the first transmitter winding portion 2223A.

Thus, the induced current in each of the coupling loop sections 2213 and 2217 flows in a direction opposite to the current flowing in the respective adjacent portions of the transmitter loops 2223A and 2223B. Consequently, adjacent ones of the second loop portions 2214 and 2218 in the center section of the scale have loop currents having opposite polarities. Thus, a secondary magnetic field is created having field portions of opposite polarity periodically distributed along the center section of the scale. The wavelength $\lambda$ of the periodic secondary magnetic field is equal to the distance between successive second loop portions 2214 (or 2218).

The read head 2220 also includes first and second receiver windings 2224 and 2226 positioned in the center of the read head 2220 between the first and second transmitter portions 2223A and 2223B.

The second loop portions 2214 and 2218 of the first and second pluralities of coupling loops 2212 and 2216 are arranged at a pitch equal to the wavelength $\lambda$. However, each of the second loop portions 2214 and 2218 extends along the measuring axis as close as possible to only one-half the wavelength $\lambda$. An insulating space 2202 is provided between each adjacent pair of second loop portions 2214 and 2218 of the first and second coupling loops 2212 and 2216, as shown in FIG. 16. Thus, the second loop portions 2214 and 2218 of the first and second coupling loops 2212 and 2216 are interleaved along the length of the scale 2210.

As shown in FIG. 18, when the read head 2220 is placed in proximity to the scale 2210, the first transmitter winding portion 2223A aligns with the first loop portion 2213 of the first coupling loop 2212. Similarly, the second transmitter winding portion 2223B aligns with the first loop portion 2217 of the second coupling loop 2216. Finally, the first and second receiver windings 2224 and 2226 align with the second loop portions 2214 and 2218 of the first and second coupling loops 2212 and 2216.

As shown in FIG. 16, two symmetrical absolute code track sensor arrays 2230 and 2240 contain six code bits per five fine wavelengths. The two symmetrical code track sensor arrays 2230 and 2240 shown in FIG. 17 are provided over the transmitter winding portions 2223A and 2223B, respectively. Each code track sensor element 2250 of the code track sensor arrays 2230 and 2240 includes a group of three three-turn windings 2251. Thus, each group of three three-turn windings 2251 generates an output that is digitized to produce one code bit. Each three-turn winding 2251 has two leads 2252A and 2252B for connection to a signal processing circuit (not shown). It should be appreciated that the windings overlap but do not physically touch one another because they are positioned on opposite sides, or different layers, of a printed circuit board (not shown).

Although the windings of the code track sensor element are not arranged in quadrature, the phase angle along the length of the code track sensor element 2250 can be determined in accordance with methods known in the art. Therefore, the difference between the phase angles of the code track and the fine wavelength scale can be used to generate an intermediate wavelength, as discussed above with respect to FIGS. 11–15.

Further, the two read heads could be used to read a twelve bit code word, or each element 2250 of the code track sensor array 2230 could be connected in series with the corresponding element of the code track sensor array 2240 to read a six bit code word with double the signal strength. Alternatively, only one of the code track sensor arrays 2230 and 2240 could be read from, while the other of the code track sensor arrays 2230 and 2240 is provided simply to cause symmetrical disruption of the transmitter fields.

In operation, a time-varying drive signal is output by the transmitter drive signal generator (not shown) to the transmitter winding terminals 2222A and 2222B. Thus, the first transmitter winding portion 2223A generates a first changing magnetic field having a first direction while the second transmitter winding portion 2223B generates a second magnetic field in a second direction that is opposite to the first direction. This second magnetic field has a field strength that is equal to a field strength of the first magnetic field generated by the first transmitter winding portion 2223A.

Therefore, when the first coupling loop 2212 is inductively coupled to the first transmitter winding portion 2223A by the first magnetic field generated by the first transmitter winding portion 2223A, the second coupling loop 2216 is inductively coupled to the second transmitter winding portion 2223B by the second magnetic field generated by the second transmitter winding portion 2223B. Thus, at this moment, if an induced current flows clockwise through the first coupling loop 2212, another induced current flows counterclockwise in the second coupling loop 2216. That is, the currents through the second portions 2214 and 2218 of the coupling loops 2212 and 2216 flow in opposite directions.

At the same time, the clockwise flowing current in each of the second portions 2214 of the first coupling loop 2212 generates a third magnetic field that descends into the plane of FIG. 18 within the second portions 2214. In contrast, at the same time, the counterclockwise flowing currents in the second loop portions 2218 of the second coupling loop 2216 generate a fourth magnetic field that rises out of the plane of FIG. 18 within the second loop portions 2218 of the second coupling loop 2216. Thus, a net alternating magnetic field is formed along the measuring axis 2106. This net alternating magnetic field has a wavelength which is equal to the wavelength λ of the first and second receiver windings 2224 and 2226. It should be appreciated that the clockwise/counterclockwise directions will be reversed one-half of the time, in accordance with the periodic drive signal.

As the read head 2220 and the scale 2210 are moved relative to one another, periodic signal outputs are produced by each of the receiver windings 2224 and 2226. Since the first and second receiver windings 2224 and 2226 are arranged in quadrature (i.e., separated by ¼ wavelength), the output signal generated by the first receiver winding 2224 is 90° out of phase with the signal output by the second receiver winding 226.

It should be appreciated that the embodiments of the arrangement of the code track described above can equally be used in this third embodiment of the compact, long-range absolute position transducer of this invention. Further, the process for determining the absolution position of the read head described above with respect to FIG. 6, is equally applicable to this third embodiment of the compact, long-range absolute position transducer of the invention. Thus, the third embodiment of the compact, long-range absolute position transducer of the invention provides all of the advantages of the first and second embodiments, and does so with a relatively smaller read head and increased output signals generated by the reduced-offset configuration of the transmitter and receiver windings.

Furthermore, although a binary code track has been described as a preferred embodiment, where each code track receiver winding provides one bit of a binary code word, those skilled in the art will recognize that higher resolution measurements can be taken from each code track receiver winding. In this case, the size of each flux modulator may be selected from a set of various sizes. Thus, each code word element corresponding to a code track receiver winding may indicate one of three or more states. Those skilled in the art will also recognize that while "balanced" windings are preferred for the code track receiver windings, simple unbalanced loops will also be sufficient under many circumstances.

While this invention has been described above in relation to an inductive transducer, this invention is readily applicable to optical, magnetic, or capacitive transducers in both linear and rotary metrology. Any type of sensor can be substituted for the receiver windings, as long as the flux modulators are replace by corresponding sensible elements.

While the preferred embodiments of this invention are generally described as using the inductive transducer of this invention, the transducers can be implemented using any known transducer configuration, such as an optical encoder. With an optical encoder, the flux modulators will instead be reflectors having a reflectance different than that of the spaces between the reflectors. The reflectors thus represent the logical "1" values, while the spaces represent the logical "0" values. The read head would include a photodetector that senses one bit at a time as either a logical "1" or "0" value, depending upon its reflectance.

This invention is described generally herein with respect to a linear position transducer. However it should be appreciated that based on this detailed description, this transducer can be readily adapted to operate as a planar rotary encoder, as set forth in the incorporated '469 and '494 applications, or as a cylindrical-rotary or other type of transducer. Additionally, to improve accuracy, or reduce demands on analog signal processing circuits for the receiver output signal, more than two overlapping receiver windings can be used in each transducer. These and other alternatives and details regarding the design and operation of the transducers disclosed herein are similar to those disclosed in the above-identified incorporated references.

In each of the above-described embodiments of the invention, the transmitter winding and the receiver windings of the fine wavelength transducers are preferably manufactured on two layers of a single printed circuit board.

While this invention has been described in conjunction with the specific embodiments outlined above, it is evident that many alternatives, modifications and variations will be apparent to those skilled in the art. Accordingly, the preferred embodiments of the invention, as set forth above, are intended to be illustrative, not limiting. Various changes may be made without departing from the spirit and scope of the invention.

What is claimed is:

1. An absolute position transducer, comprising:

a scale member;

a read head member, the read head member and the scale member movable relative to each other along a measuring axis;

a code track position transducer providing an output that defines a position of the read head relative to the scale member to a first resolution, comprising:

at least one set of code track sensors formed on the read head member, each set of code track sensors including a number N of sensors, where N is a positive integer greater than 1, and a code track formed on the scale member, the code track having a plurality of zones distributed along the measuring axis, at least one sensible element formed in at least some of the plurality of zones;

an intermediate position transducer device that provides a continuously varying output that defines a position of the read head relative to the scale member to a second resolution finer than the first resolution, the continuously varying output varying periodically over an intermediate wavelength, the intermediate position transducer device comprising at least one position transducer formed on the read head and scale member; and a signal processing circuit electrically connected to each set of code track sensors and the at least one position transducer;

wherein:

the sensible elements modulate an output of the sensors of each set of code track sensors based on a relative position between the read head member and the scale member;

the sensible elements are distributed on the scale member such that each zone is capable of producing one of a set of output states in an overlying sensor, the zones forming a series of code elements extending along the measuring axis, the code elements arranged into blocks of n code elements forming a code word; and each intermediate wavelength coinciding with a set of m identical blocks of n code elements, where m is an integer at least equal to one.

2. The absolute position transducer of claim 1, wherein the at least one set of sensors are at least one set of receiver windings, and the sensible elements modulate an inductive flux coupling to the receiver windings.

3. The absolute position transducer of claim 2, wherein the code track position transducer includes a code track transmitter winding formed on the read head member.

4. The absolute position transducer of claim 3, wherein:

the code track transmitter winding and each receiver winding form an inductive coupling; and the sensible elements modulate the inductive coupling between each receiver winding and the code track transmitter winding.

5. The absolute position transducer of claim 2, wherein the plurality of sensible elements of the code track includes one of a plurality of flux disrupters, a plurality of flux enhancers, a plurality of flux disrupters and flux enhancers, and a plurality of coupling loops.

6. The absolute position transducer of claim 1, wherein:

the at least one set of code track sensors comprises a first set of code track sensors and a second set of code track sensors; and the second set of code track sensors is spatially offset from the first set of code track sensors along the measuring axis.

7. The absolute position transducer of claim 1, wherein the absolute position transducer is included in one of a caliper, a linear scale, a micrometer, a rotary encoder, a tape measure and a height gage.

8. The absolute position transducer of claim 1, wherein the at least one position transducer of the intermediate position transducer device comprises at least one fine track transducer, each fine track transducer producing cyclic signals at a distinct spatial frequency, wherein each fine track transducer comprises:

at least one fine track sensor formed on the read head member; and a fine track scale portion formed on the scale member, the scale portion including a plurality of sensible elements spatially distributed on the scale member along the measuring axis at the distinct spatial frequency such that an output of the at least one sensor is based on a relative position between the read head member and the scale member;

wherein one of the at least one fine track transducers defines a fine position of the read head member relative to the scale member to a third resolution finer than the second resolution defined by the intermediate wavelength.

9. The absolute position transducer of claim 8, wherein a phase difference between the code track transducer and one of the at least one fine track transducers generates the intermediate wavelength.

10. The absolute position transducer of claim 8, wherein the at least one fine track transducer includes two fine track transducers, and a phase difference between the two fine track transducers generates the intermediate wavelength.

11. The absolute position transducer of claim 8, wherein each of the at least one fine track sensors comprises a fine track receiver winding, and the sensible elements modulate an inductive flux coupling to the receiver windings.

12. The absolute position transducer of claim 11, wherein each fine track transducer includes a fine track transmitter winding formed on the read head member.

13. The absolute position transducer of claim 12, wherein:

each fine track transmitter winding and each receiver winding, respectively, form an inductive coupling; and the plurality of sensible elements of the fine track transducers includes one of a plurality of flux disrupters, a plurality of flux enhancers, a plurality of flux disrupters and flux enhancers, and a plurality of coupling loops.

14. The absolute position transducer of claim 11, wherein the plurality of sensible elements of the fine track scale portion includes one of a plurality of flux disrupters, a plurality of flux enhancers, a plurality of flux disrupters and flux enhancers, and a plurality of coupling loops.

15. The absolute position transducer of claim 8, wherein:

each at least one fine track sensor comprises a first fine track receiver winding and a second fine track receiver winding; and the first fine track receiver winding is spatially offset from the second fine track receiver winding along the measuring axis.

16. The absolute position transducer of claim 15, wherein the first fine track receiver winding is spatially offset from the second fine track receiver winding by one-quarter of a wavelength of the at least one fine track receiver winding.

17. The absolute position transducer of claim 16, wherein a single transmitter winding forms both the fine track transmitter winding and a code track transmitter winding.

18. The absolute position transducer of claim 15, wherein:
each at least one fine track sensor comprises a third fine track receiver winding; and
the first, second and third fine track receiver windings are spatially offset relative to one-another by one-sixth of a wavelength of the at least one fine track receiver winding.

19. The absolute position transducer of claim 8, wherein:
each at least one fine track sensor comprises a number p of fine track receiver windings, where p is at least equal to three; and
each of the p fine track receiver windings are spatially offset from one another along the measuring axis by $\lambda/2p$, where $\lambda$ is a wavelength of the p fine track receiver windings.

20. The absolute position transducer of claim 1, wherein the at least one position transducer of the intermediate position transducer device comprises an intermediate track transducer, comprising:
at least one intermediate track sensor formed on the read head member, and
an intermediate track scale portion formed on the scale member, the intermediate track scale portion including a plurality of sensible elements spatially distributed on the scale member along the measuring axis at a medium spatial frequency corresponding to the intermediate wavelength;
the intermediate track transducer defining an intermediate position of the read head member relative to the scale member to the second resolution.

21. The absolute position transducer of claim 20, further comprising a fine track transducer, comprising:
at least one fine track sensor formed on the read head member, and
a fine track scale portion formed on the scale member, the fine track scale portion including a plurality of sensible elements spatially distributed on the scale member along the measuring axis at a fine spatial frequency;
the fine track transducer defining a fine position of the read head member relative to the scale member to a third resolution finer than the second resolution defined by the intermediate track position transducer.

22. The absolute position transducer of claim 1, wherein, when the sets of the code track sensors overly a boundary between two blocks of n code elements, the signal processing circuit determines an operable sequence of at least one of the blocks based on the output of the intermediate position transducer device.

23. A method for determining an absolute position of a first member relative to a second member in an absolute position transducer, comprising:
inputting a set of j adjacent code element measurements, each code element measurement responsive to at least one of a plurality of code elements positioned on one of the first and second members and extending along a measurement axis;
converting each of the j code element measurements into an output value;
determining a relative position of the j output values to a starting point of a j-digit absolute position code word;
determining the j-digit absolute position code word based on the determined relative position of the j output values to the starting point; and
determining a first-resolution absolute position measurement based on the j-digit code word.

24. The method of claim 23, further comprising:
taking a second-resolution incremental position measurement between the first and second members at a second resolution; and
determining a second-resolution absolute position measurement between the first and second members from the first-resolution absolute position measurement and the second-resolution incremental position measurement;
wherein the first resolution is coarser than the second resolution.

25. The method of claim 24, wherein taking the second-resolution incremental position measurement comprises:
determining a phase $\phi_F$ of the second resolution incremental position measurement, and
determining the second-resolution incremental position measurement from the phase $\phi_F$ and an incremental scale wavelength $\lambda_F$.

26. The method of claim 23, wherein determining the relative position of the j output values to the starting point of the j-digit absolute position code word comprises:
determining a intermediate relative position of the first and second members within an intermediate wavelength of the absolute position transducer; and
determining the relative position of the j output values to the starting point of the absolute position code word based on 1) the determined intermediate relative position of the first and second members and 2) a predetermined relationship between the relative position of the starting point and the intermediate relative position of the first and second members.

* * * * *

UNITED STATES PATENT AND TRADEMARK OFFICE
CERTIFICATE OF CORRECTION

PATENT NO. : 6,157,188
DATED : December 5, 2000
INVENTOR(S) : Kurt E. Steinke

It is certified that error appears in the above-indentified patent and that said Letters Patent is hereby corrected as shown below:

ON THE TITLE PAGE
Item [56] References Cited, the following is added:

U. S. PATENT DOCUMENTS

| EXAMINER INITIAL | | PATENT NUMBER | | | | | | ISSUE DATE | PATENTEE | CLASS | SUBCLASS | FILING DATE IF APPROPRIATE |
|---|---|---|---|---|---|---|---|---|---|---|---|---|
| | | 5 | 0 | 2 | 3 | 5 | 9 | 6/91 | Andermo | 324 | 662 | |

Signed and Sealed this

Twenty-seventh Day of March, 2001

Attest:

NICHOLAS P. GODICI

Attesting Officer

Acting Director of the United States Patent and Trademark Office